(12) United States Patent
Tauzin et al.

(10) Patent No.: US 7,588,997 B2
(45) Date of Patent: Sep. 15, 2009

(54) METHOD OF FABRICATING A THIN FILM

(75) Inventors: Aurélie Tauzin, Grenoble (FR);
Sébastien Personnic, Grenoble (FR);
Frédéric Laugier, Saint-Egreve (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 43 days.

(21) Appl. No.: 11/504,295

(22) Filed: Aug. 14, 2006

(65) Prior Publication Data

US 2007/0212852 A1    Sep. 13, 2007

(30) Foreign Application Priority Data

Mar. 13, 2006    (FR)    ................................ 06 50832

(51) Int. Cl.
*H01L 21/30* (2006.01)
*H01L 21/46* (2006.01)

(52) U.S. Cl. ................ 438/455; 438/527; 257/E21.088

(58) Field of Classification Search ................ 438/149, 438/407, 455, 458, 459, 471–475, 510, 514, 438/518, 520, 522, 526, 528, 530, 527
See application file for complete search history.

(56) References Cited

U.S. PATENT DOCUMENTS

| 5,374,564 A | 12/1994 | Bruel et al. ................ 437/24 |
| 2004/0058555 A1 | 3/2004 | Moriceau et al. ............ 438/736 |
| 2004/0166651 A1* | 8/2004 | Aspar et al. ................ 438/455 |
| 2005/0148163 A1* | 7/2005 | Nguyen et al. .............. 438/514 |
| 2006/0019476 A1 | 1/2006 | Lagahe et al. ............... 438/514 |
| 2007/0037363 A1* | 2/2007 | Aspar et al. ................. 438/459 |

FOREIGN PATENT DOCUMENTS

| FR | 2 773 261 | 7/1999 |
| FR | 2 861 497 | 4/2005 |
| KR | 2001-109791 D2 | 12/2001 |
| KR | 2004-51605 (D1) | 6/2004 |

(Continued)

OTHER PUBLICATIONS

Auberton-Hervé, A.J. et al, entitled "Why can Smart Cut change the future of microelectronics?," Int. Journal of High Speed Electronics and Systems, vol. 10, No. 1, 2000, pp. 131-146.

(Continued)

*Primary Examiner*—Phat X Cao
*Assistant Examiner*—Nga Doan
(74) *Attorney, Agent, or Firm*—Winston & Strawn LLP

(57) ABSTRACT

A method of fabricating a thin film is disclosed. The method comprises: implanting ions by bombarding a face of a substrate comprising a semiconductor material to form a concentrated layer of the implanted ions at a predetermined mean depth in the substrate, the concentrated layer and the face of the substrate defining a thin film therebetween; trapping contaminants included in the substrate or the thin film, in the concentrated layer by heat treating the substrate such that the heat treatment does not split the substrate at the concentrated layer; detaching the thin film from the substrate after the trapping by splitting the substrate at the concentrated layer; and withdrawing a zone of the thin film perturbed by the trapping and the detaching.

17 Claims, 8 Drawing Sheets

FOREIGN PATENT DOCUMENTS

WO    WO 2004/032183 A2    4/2004

OTHER PUBLICATIONS

M. Zhang, et al, Comparison of Cu gettering to $H^+$ and $He^+$ implantation-induced cavities in separation-by-implantation-of-oxygen wafers by Journal of Applied Physics, vol. 85, n° 1, Jan. 1, 1999.

A. Kinomura et al, "Gettering of platinum and silver to cavities formed by hydrogen implantation in silicon" by Nuclear Instruments and Methods in Physics Research B 127/128 (1997), 297-300.

Hon Wai Lam, "SIMOX SOI for Integrated Circuit Fabrication," IEEE Circuits and Devices Magazine, Jul. 1987.

\* cited by examiner

METHOD OF FABRICATING A THIN FILM

TECHNICAL FIELD AND PRIOR ART

The present invention relates to a method of fabricating a thin film of semiconductor material involving the SMART CUT® technique. An example of the use of the SMART CUT® technique has been described in U.S. Pat. No. 5,374,564 and in the article by A. J. Auberton-Hervé et al, entitled "*Why can Smart Cut change the future of microelectronics?*," Int. Journal of High Speed Electronics and Systems, Vol. 10, No. 1, 2000, pp. 131-146.

BACKGROUND OF THE INVENTION

This SMART CUT® technique employs the following steps:

a) bombarding a first face of a substrate, for example, formed from silicon, with hydrogen or rare gas type light ions, for example, helium, to implant the ions in a sufficient concentration into the substrate and create a layer of weakening micro-cavities;

b) bringing the face of the substrate into intimate contact with a stiffener or receiving substrate; and c) fracturing/splitting at the layer of micro-cavities by applying a heat treatment and/or mechanical detachment stress, such as inserting a blade at the level of the layer of micro-cavities, applying tensile, bending and/or shear stresses, and/or applying ultrasound or microwaves of suitable power and frequency.

By detaching a portion of the implanted substrate, the SMART CUT® method can produce a thin film with a homogeneous thickness substantially corresponding to the distance between the face of the bombarded substrate and the layer of micro-cavities formed by implantation.

Compared with other known methods of fabricating thin films, such as the method known as "SIMOX" (described in the document "*SIMOX SOI for Integrated Circuit Fabrication*," Hon Wai Lam, IEEE Circuits and Devices Magazine, July 1987) or methods of thinning a wafer by chemical or any other chemical-mechanical abrasion, that do not require very high implantation doses, nor an etch-stop barrier.

However, with "SIMOX", the bulk of the transferred thin film contains a simple metal (Al), transition metals (Ti, Cr, Fe, Co, Ni, Cu, Zn, etc), alkali metals (Li, Na, K etc), alkaline-earth metals (Mg, Ca, Ba, etc), halogen (F, Br, Cl), metalloid (As), or organic types of contaminants (C, N, O) as contaminating impurities. Those impurities correspond to impurities present in the starting substrate and/or impurities introduced by the method employed. As an example, the presence of transition metal type impurities may cause large variations in the electrical properties in the transferred thin film.

SUMMARY OF THE INVENTION

The invention aims to overcome the disadvantages mentioned above and proposes a solution which allows the production of thin films by a method comprising a step of implanting light ions to create a layer of micro-cavities corresponding to a zone of weakness at which the substrate can be split using for example, the SMART CUT® technique, while reducing the bulk concentration of impurities present in the detached film.

This is achieved by a method of fabricating a thin film, comprising:

implanting ions by bombarding a face of a substrate comprising a semiconductor material to form a concentrated layer of the implanted ions at a predetermined mean depth in the substrate, the concentrated layer and the face of the substrate defining a thin film therebetween;

trapping contaminants included in the thin film and/or the substrate, in the concentrated layer by heat treating the substrate such that the heat treatment does not split the substrate at the concentrated layer;

detaching the thin film from the substrate after the trapping by splitting the substrate at the concentrated layer; and withdrawing a zone of the thin film perturbed by the trapping and the detaching.

In other embodiments, the thin film is fabricated by a method comprising:

a) at least one step of implantation by bombarding a first face of a substrate formed from a semiconductor material with light ions of the hydrogen or helium type, alone or in combination with other elements or species, for example, by boron-hydrogen co-implantation, to form, at a predetermined mean depth in the substrate, a layer in which the implanted ions are concentrated, the concentrated layer defining a thin film in the upper portion of the substrate;

b) a step of bringing the face of the substrate into intimate contact with a stiffener; and c) a step of detaching the thin film in contact with the stiffener by splitting at the concentrated layer of ions;

wherein after the implantation step a) and before the detachment step c), a heat treatment step is carried out to trap contaminants in the concentrated layer of implanted ions, such that the treatment does not causing splitting of the substrate at the concentrated layer of implanted ions. After step c), the zone perturbed by trapping the contaminants and by the detachment step is eliminated.

The heat treatment step carried out after implantation can provide many advantages. The heat treatment step allows the development/formation of micro-cavities at the concentrated layer of implanted ions which form trapping cavities. The heat treatment step also allows diffusion and trapping of the contaminants in the cavities. The portion of the substrate located above the trapping micro-cavities can correspond to the thin film to be transferred. Thus, the thin film can have a reduced concentration of contaminating species except at the surface. Chemical-mechanical polishing and/or appropriate selective chemical attack can eliminate the surface zone which has been perturbed and contaminated by trapping of the contaminants and by the detachment step. As a result, the method of the invention allows the production of thin films having a reduced concentration of contaminating species.

The substrate may be a substrate of silicon, germanium, silicon-germanium, gallium nitride, gallium arsenide or silicon carbide among others;

In an aspect of the invention, the method can comprises an additional or second implantation step consisting of bombarding the face of the substrate under implantation conditions which are different from those used for the implantation of step a) or the first implantation. The additional implantation step can be carried out at a greater implantation energy than an implantation energy used by the first implantation or step a). This creates a concentrated layer of additional ions at a greater mean depth than the concentrated layer of ions created during step a).

In this aspect of the invention, the trapping cavities are developed/formed in the concentrated layer of additional ions located below the concentrated layer of ions intended to form a plane of weakness along which the thin film is to be detached. The contaminants are then trapped in a zone located below the thin film detachment zone and are confined in the bulk of the substrate which does not form part of the thin film to be transferred.

The additional implantation step may be carried out with helium gas ions.

In step c), detachment of the thin film (substrate fracture) may be brought about by a detachment stress applied at the concentrated layer of implanted ions. The detachment stress may consist of applying a heat treatment, a detachment mechanical stress such as insertion of a blade at the concentrated layer of implanted ions, the application of tensile stresses, the application of ultrasound or microwaves with a suitable power and frequency, or a combination thereof. In some embodiments, the heat treatment can comprise, for example, an anneal carried out at a temperature which is higher than the temperature of the trapping heat treatment.

BRIEF DESCRIPTION OF THE DRAWINGS

Other characteristics, preferred features and advantages of the invention become apparent from the following description made with reference to the accompanying drawings, which represent a possible implementation in an indicative but non-limiting manner, and wherein.

It is to be understood that both the foregoing general description and the following detailed description are exemplary and explanatory only and are intended to provide a further explanation of the present invention, as claimed.

DETAILED DESCRIPTION OF EMBODIMENTS OF THE INVENTION

The method of the present invention is applicable in general to the fabrication of thin films of semiconductor materials from any type of substrate compatible with the SMART CUT® technique. Such substrates are in particular substrates of silicon (Si), germanium (Ge), silicon-germanium (SiGe), gallium nitride (GaN), gallium arsenide (GaAs), silicon carbide (SiC), or other substrates known in the art.

The invention proposes applying, during the fabrication of a thin film using the SMART CUT® technique, an additional heat treatment step, after the implantation step and before the detachment step. The additional heat treatment step serves to form micro-cavities at the implanted layer in which any contaminants present in a starting substrate and/or introduced during the implantation and bonding steps are trapped. The micro-cavities have incomplete chemical bonds on their internal walls which can trap atoms of contaminating species.

This additional heat treatment must be carried out at a temperature sufficiently high to allow the contaminating species to diffuse into the trapping micro-cavities but without exceeding the limiting temperature which causes fracture of the substrate at the implantation layer by a crystal rearrangement effect in the substrate and pressure in the micro-cavities. The trapping micro-cavities may have developed and/or been formed directly in the implantation layer intended to cause splitting of the substrate (SMART CUT® technique) or in a separate implantation layer formed beneath the layer.

The documents "*Comparison of Cu Gettering to $H^+$ and $He^+$ Implantation-Induced Cavities in Separation-By-Implantation-Of-Oxygen Wafers*" by M. Zhang et al, Journal of Applied Physics, Vol 85, n° 1, Jan. 1, 1999, and "*Gettering of Platinum and Silver to Cavities Formed by Hydrogen Implantation in Silicon*" by A. Kinomura et al, Nuclear Instruments and Methods in Physics Research B 127/128 (1997), 297-300, disclose the formation of trapping cavities by $H^+$ or He implantation followed by heat treatment. However, the trapping cavities are not used to fracture/split the substrate. In contrast, in those two documents, the contaminants are deliberately introduced by ion implantation and are conserved in the substrate.

A method of producing a thin film in accordance with an embodiment of the invention is described below with reference to FIGS. 1A to 1E and 2.

In this embodiment, a starting substrate or donor substrate 1 is constituted by a wafer of mono-crystalline silicon covered with a layer 2 of silicon oxide ($SiO_2$) obtained by thermal oxidation and having a thickness of about 1450 Angstroms (Å).

Figure 1A:
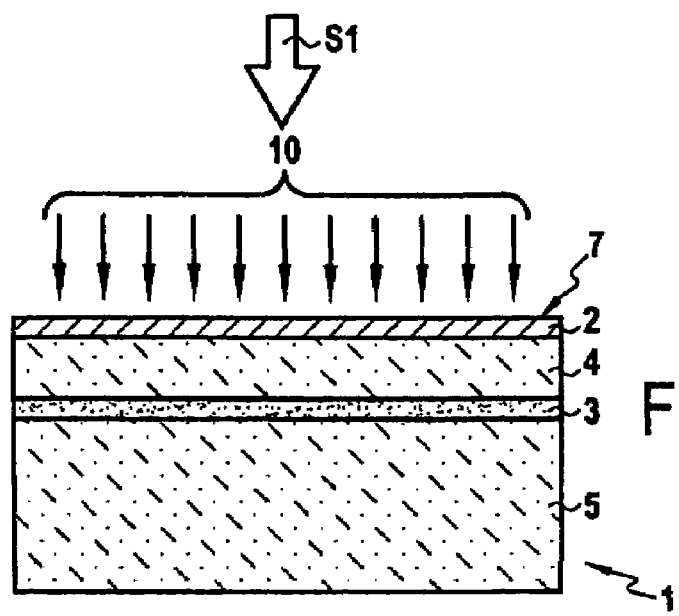
FIGS. 1A to 1E are cross-sectional views showing a production of a thin film, in accordance with an embodiment of the invention.

In a first implantation step S1, substrate 1 undergoes ionic bombardment 10 of hydrogen ions $H^+$ through a flat face 7 of substrate 1 comprising the $SiO_2$ layer 2. Implantation of $H^+$ ions is carried out, for example, at an implantation energy of about 37 kilo-electron volts (keV) and at an implantation dose of, for example, about $5.75 \times 10^{16}$ atoms/square centimeter (atoms/cm²). These implantation conditions allow a concentrated layer 3 of ions to be created parallel to flat face 7 of donor substrate 1 at a predetermined mean depth in donor substrate 1, defining a thin film 4 in the upper region of donor substrate 1 and a lower region portion 5 in donor substrate 1 corresponding to a remainder of donor substrate 1 (FIG. 1A).

The implantation dose is selected so that the concentration of $H^+$ ions in concentrated layer 3 is sufficient to create a layer of micro-cavities directly after implantation or during a subsequent heat treatment step. However, it should be noted that micro-cavities may already have formed during implantation. The mean depth of penetration of the $H^+$ ions into the substrate is principally determined by the implantation energy level. In the example described here, implantation is carried out at an implantation energy of about 37 keV, which allows concentrated layer 3 of $H^+$ ions to be formed about 300 nanometers (nm) beneath flat face 7 of donor substrate 1 to form a bombarded or implanted starting substrate 1.

The implanted starting substrate 1 is then bonded in step S2 (FIG. 1B), for example by molecular bonding, to a stiffener 6, for example a wafer of silicon. The starting substrate 1 can contain residual impurities or contaminants such as, fluorine F, carbon C, or other elements known in the art. Furthermore, the steps of oxidation (formation of $SiO_2$ layer), ion implantation and bonding may increase the amount of contamination by impurities in the starting substrate 1.

Figure 1B:
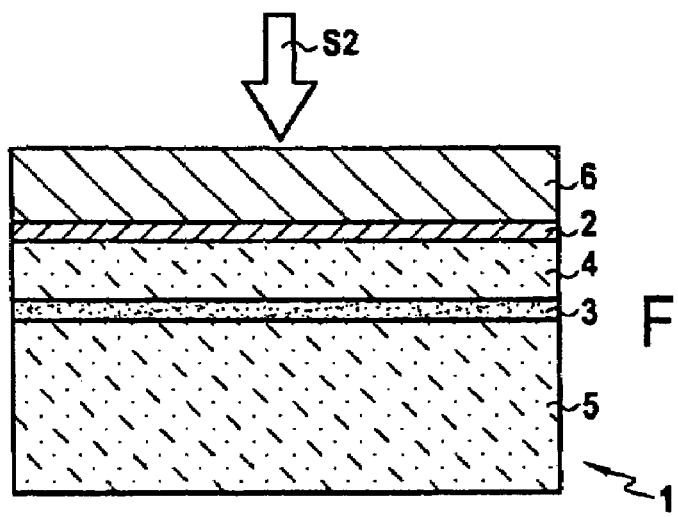
Figure 1C:
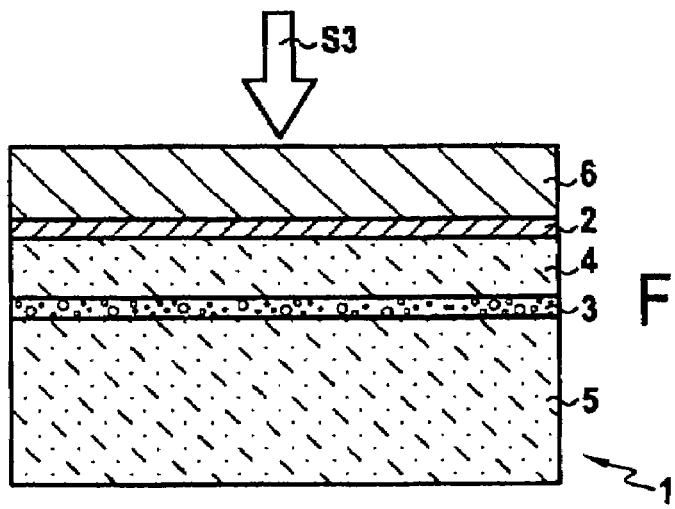

In accordance with the invention, a suitable heat treatment step S3 is carried out which allows the development and/or formation of micro-cavities in concentrated layer 3 of $H^+$ ions and diffusion of various contaminating species to the micro-cavities in concentrated layer 3 where they are trapped (FIG. 1C). In this embodiment, the micro-cavities in concentrated layer 3 not only constitute traps for the diffused contaminating species, but also a plane of weakness allowing subsequent fracture of donor substrate 1 along concentrated layer 3 by applying mechanical stresses.

The heat treatment step may, for example, be an anneal at 350° C. for a period of 18 hours (h). Such an anneal can locally increase a quantity of fluorine ions at concentrated layer 3 by a factor of 50 and, as a result, reduce the concentration of fluorine ions in the remainder of donor substrate 1. In particular, the heat treatment may reduce the concentration of fluorine ions in a portion of donor substrate 1 corresponding to thin film 4 to be detached later. The 350° C. anneal for 18 h can also halve the concentration of carbon impurities in thin film 4. Finally, the 350° C. for 18 h anneal causes the formation of micro-cavities which locally weaken the substrate and endow this region, i.e. at concentrated layer 3, with characteristics, for example, density, dimensional, distributional, morphological, and other material characteristics known in the art, that are compatible with a fracture.

In the example described here, the heat treatment step S3 is carried out after the bonding step S2 onto stiffener 6. However, heat treatment step S3 may be carried out before the bonding step S2 onto stiffener 6.

Figure 1D:
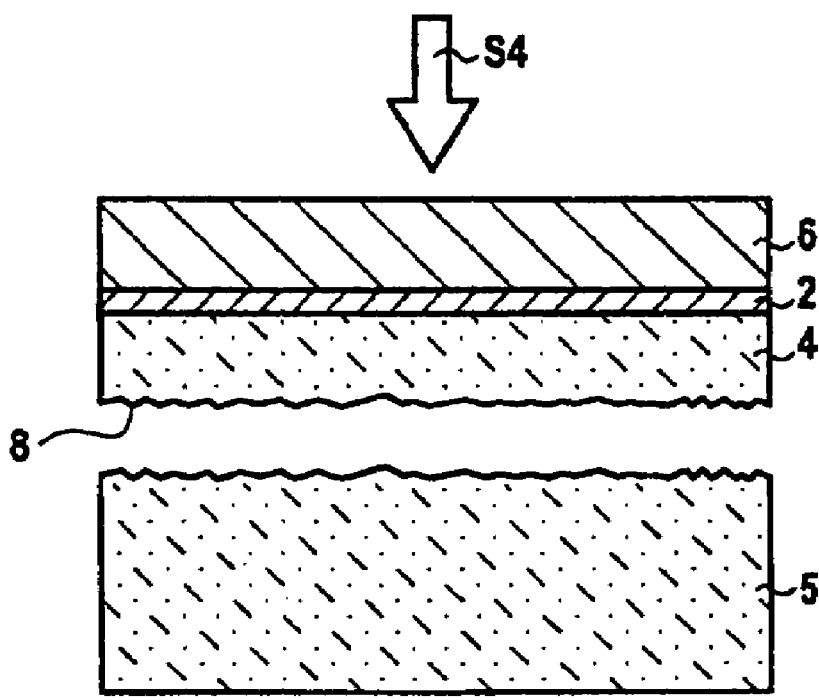

After the heat treatment step S3, thin film 4 is detached from starting substrate 1 by splitting S4 (FIG. 1D). This step is, for example, carried out by applying mechanical stresses known in the art, such as by inserting a blade at the micro-cavity zone along concentrated layer 3, causing a fracture to propagate along the micro-cavity zone.

Thin film 4 transferred onto stiffener 6 contains few contaminants apart from at a fractured surface 8 that, after the heat treatment step S3, concentrates the contaminating species that have diffused and are trapped in the micro-cavities.

Figure 1E:
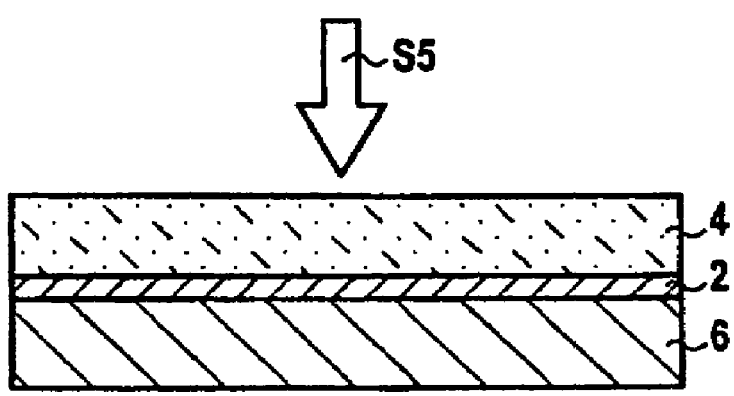

A conventional withdrawing step S5, such as chemical-mechanical polishing, can then eliminate or withdraw a perturbed contaminated zone of fractured surface 8 and reduce its roughness (FIG. 1E). The thickness withdrawn by polishing is on the order of about 1500 Å. The contaminated/perturbed zone may also be eliminated by selective chemical attack, for example, etching, optionally followed by polishing to improve the surface roughness.

A final high temperature heat treatment step S6 may then be applied to consolidate the structure and repair any defects present in the transferred film for example, at about 1100 C.

FIGS. 3A to 3F and FIG. 4 illustrate a variation of a method of producing a thin film in accordance with the invention. In this embodiment, two layers of micro-cavities are formed in the substrate at different mean depths, a first layer to trap the contaminants and a second layer to allow the thin film to be detached.

A starting substrate 10 is constituted by a wafer of monocrystalline silicon covered with a $SiO_2$ layer 11 obtained by thermal oxidation and having a thickness of about 1450 Å.

Figure 3A:
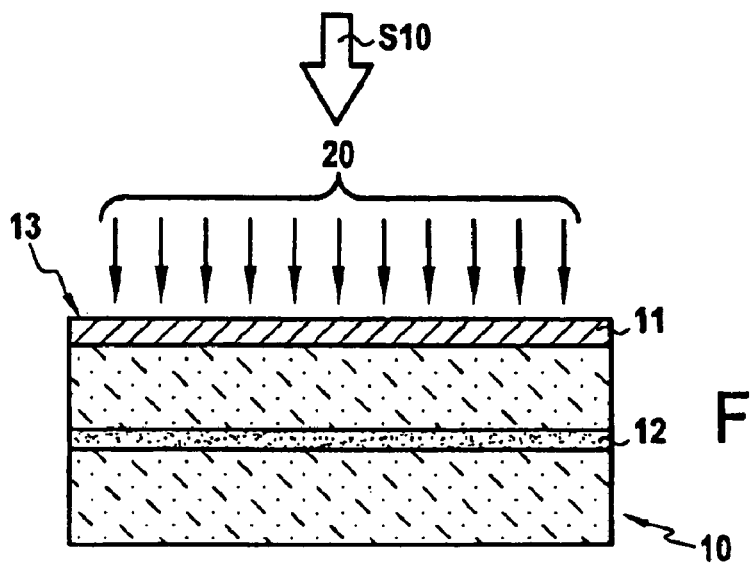
FIGS. 3A to 3F are cross-sectional views showing a production of a thin film in accordance with an embodiment of the invention.

In a first implantation step S10, starting substrate 10 is subjected to ionic bombardment 20 of helium ions He through a flat face 13 of starting substrate 10 comprising $SiO_2$ layer 11. He ion implantation is carried out at an implantation energy of about 60 keV and an implantation dose of about $1.5 \times 10^{16}$ atoms/cm². These implantation conditions allow a concentrated layer 12 of He ions to be created in starting substrate 10 at a mean depth of about 300 nm (FIG. 3A).

Figure 3B:
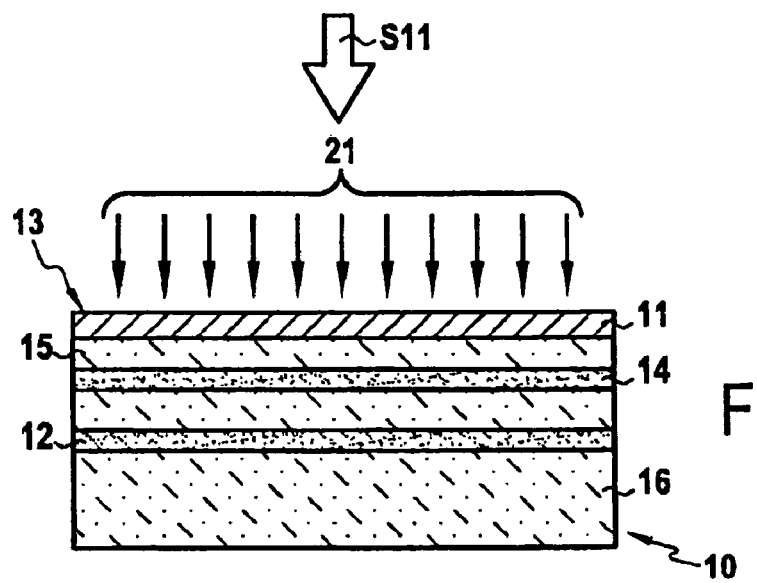
Figure 3C:
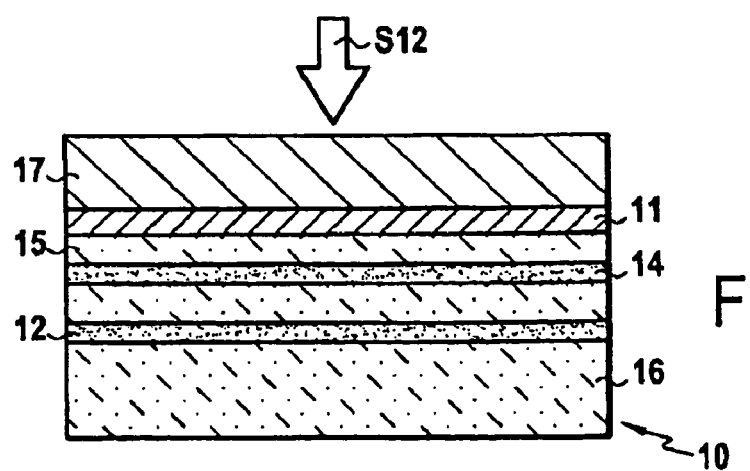
Figure 3D:
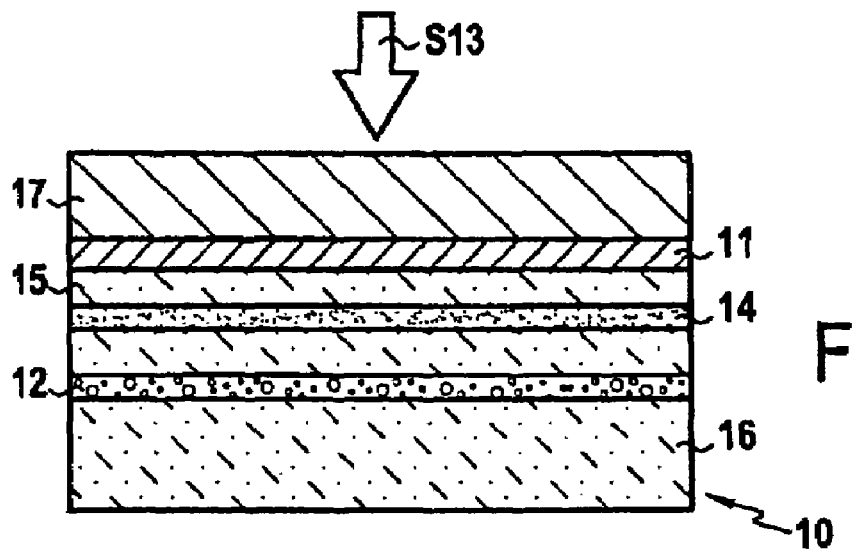
Figure 3E:
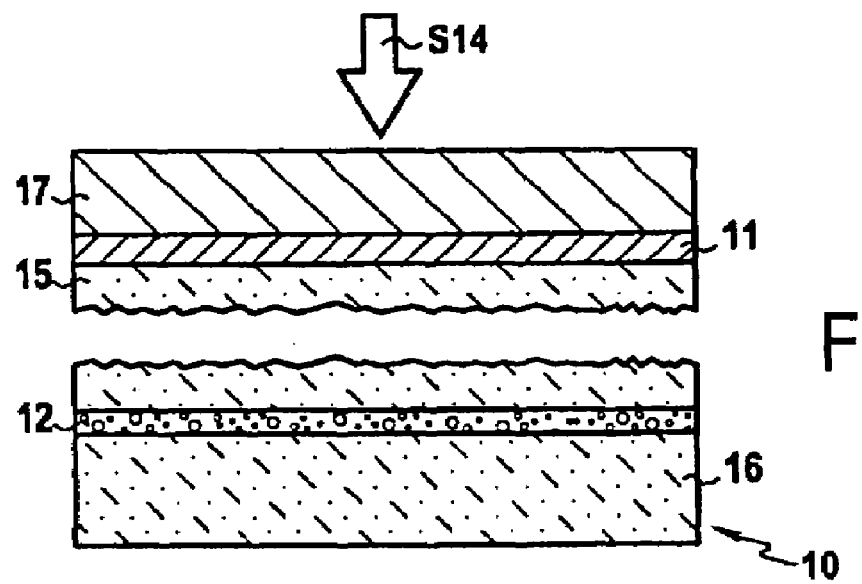

In a second implantation step S11 that may be before or after the first He ion implantation step S10, starting substrate 10 undergoes ionic bombardment 21 of hydrogen ions $H^+$ through flat face 13. $H^+$ ion implantation is carried out at an implantation energy of about 32 keV and an implantation dose of about $1.5 \times 10^{16}$ atoms/cm². These implantation conditions allow a concentrated layer 14 of $H^+$ ions to be created at a mean depth of about 230 nm in starting substrate 10, defining a thin layer 15 in an upper region of starting substrate 10 and a remainder portion 16 in a lower region of starting substrate 10 corresponding to the remainder of the substrate 10 (FIG. 3B).

In the first implantation step S10 (FIG. 3A), the implantation energy is higher than the second implantation step S11. This can create and locate concentrated layer 12 of He ions more deeply with respect to flat face 13 of starting substrate 10 than concentrated layer 14 of $H^+$ ions created during the second implantation step S11 (FIG. 3B).

The implanted starting substrate 10 is then bonded in step S12 (FIG. 3C), for example by molecular bonding, to a stiffener 17, for example a silicon wafer. Starting substrate 10 contains residual impurities such as fluorine F, carbon C, or other impurities known in the art. Furthermore, the steps of oxidation (formation of a layer of $SiO_2$), ion implantation, and bonding may increase the amount of contamination by impurities in starting substrate 10.

In accordance with the invention, a heat treatment step S13 (FIG. 3D) allows the development and/or formation of micro-cavities in concentrated layer 12 of He ions as well as the diffusion and trapping of the various contaminating species in the micro-cavities. The formation of micro-cavities can be 300 nm beneath flat surface 13 of starting substrate 10. In this embodiment, the micro-cavities of concentrated layer 12 of He ions only constitute traps for the diffused contaminating species.

The heat treatment step S13 may, for example, be an anneal at 400° C. for 1 h to locally increase the quantity of fluorine ions and carbon impurities in concentrated layer 12 of He ions and, as a result, to reduce the concentration of fluorine ions and carbon impurities in remainder portion 16 of starting substrate 10 and in particular in a portion corresponding to the thin film 15 to be detached later. A portion of the impurities is also trapped in concentrated layer 14 of $H^+$ ions, but in a smaller quantity in comparison to concentrated layer 3 of $H^+$ ions of the embodiment described with reference to FIGS. 1A to 1E and 2.

This heat treatment step may be carried out before or after the step of bonding the stiffener.

A detaching step S14, for example, an anneal step (FIG. 3E) is then carried out at a temperature which is higher than the temperature of the heat treatment for trapping contaminants and which is sufficient to create, by a crystal rearrangement effect in substrate 10 and pressure in the micro-cavities of the concentrated layer 14 of $H^+$ ions, causing a split between thin film 15 and remainder portion 16 of starting substrate 10. An anneal at 500° C. for 30 minutes (min) can cause substrate 10 to fracture at concentrated layer 14 of $H^+$ ions. Concentrated layer 14 of $H^+$ ions can be located about 230 nm beneath flat surface 13 of substrate 10.

Thin film 15 transferred to stiffener 17 may be about 230 nm thick and may contain few contaminants and on a perturbed zone surface, since a portion of the contaminants has been confined to the trapping micro-cavities of non-transferred concentrated layer 12 of He ions which subsists in remainder portion 16 of substrate 10.

Figure 3F:
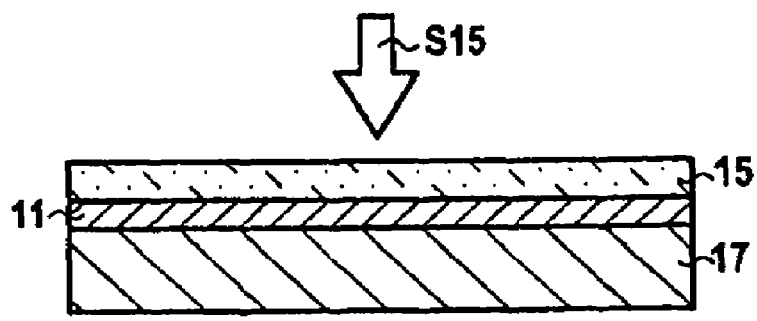
Figure 4:
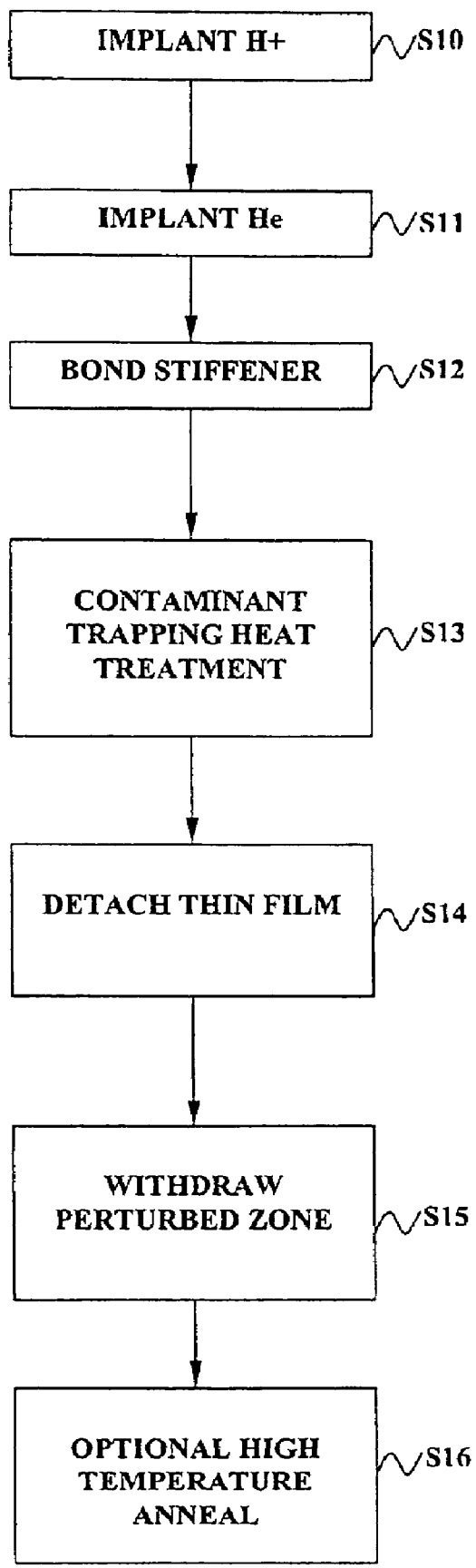
FIG. 4 is a flow-chart illustrating the steps used in FIGS. 3A to 3F.

A conventional withdrawing step S15, for example, chemical-mechanical polishing is then carried out to eliminate a perturbed zone of a surface of thin film 15 and to reduce its roughness (FIG. 3F). The thickness removed by polishing is on the order of about 1500 Å. The perturbed zone may also be eliminated by selective chemical attack (etching) optionally followed by polishing to improve the surface roughness.

A final high temperature (1100° C.) heat treatment step S16 may be carried out to improve the quality of the transferred film.

Measurements were carried out (FIGS. 5 to 7) to demonstrate that, for implantation conditions compatible with a subsequent step of fracture at the implanted zone, a post-implantation heat treatment can trap contaminants present in the implanted substrate.

Figure 2:
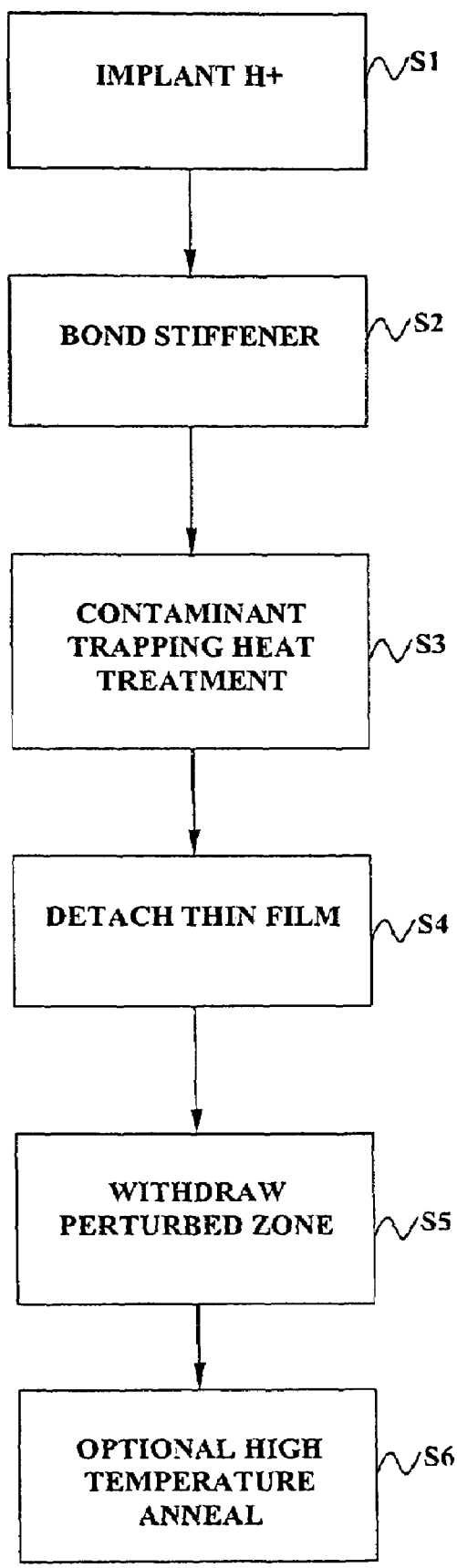
FIG. 2 is a flow-chart illustrating the steps used in FIGS. 1A to 1E.
Figure 5:
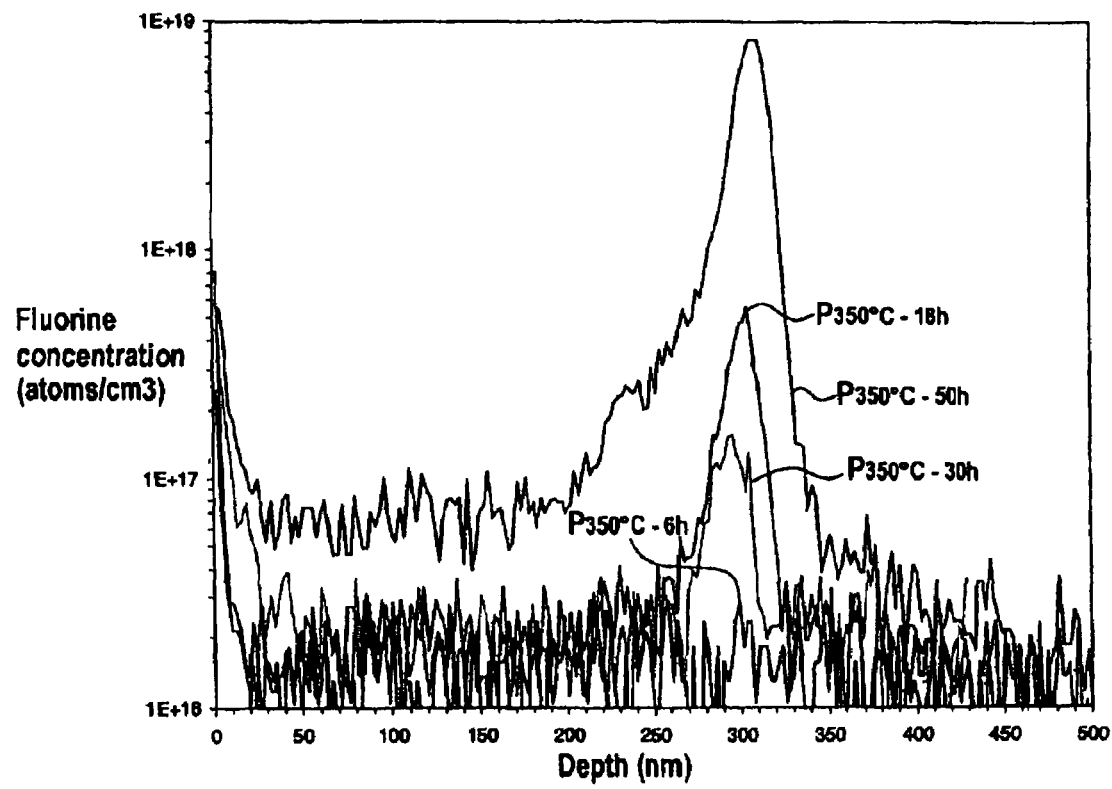
FIG. 5 is a chart plotting a fluorine concentration in a Si substrate as a function of the duration of the contaminant trapping heat treatment of the invention.
Figure 6:
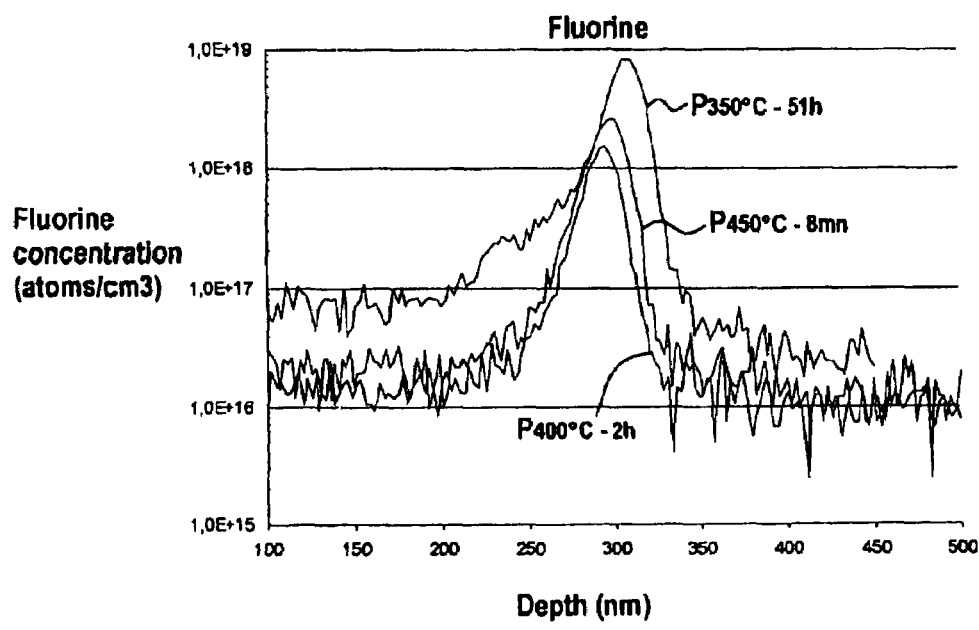
FIG. 6 is a chart plotting a concentration of fluorine in a Si substrate as a function of a duration and temperature of the contaminant trapping heat treatment of the invention.
Figure 7:
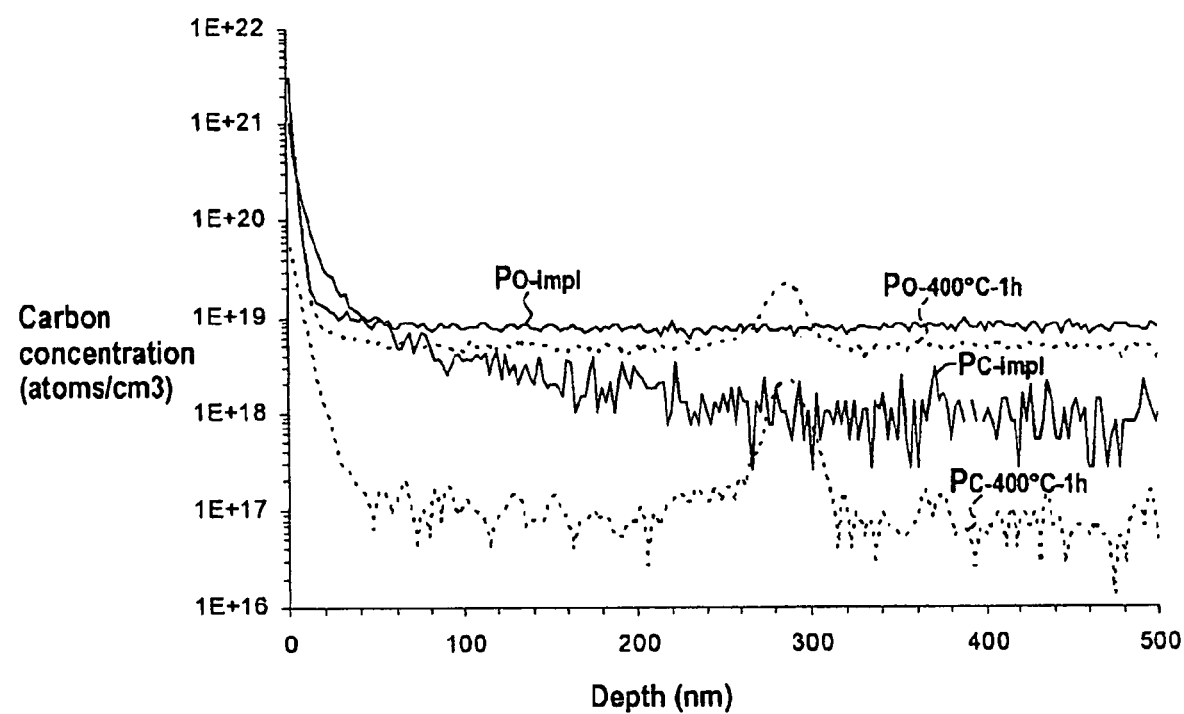
FIG. 7 is a chart plotting an influence of the trapping heat treatment of the invention on contaminants of various natures.

FIGS. 5 to 7 show the results of measurements of the concentration of contaminants obtained in mono-crystalline silicon substrates implanted under the conditions described with reference to FIGS. 1A and 1B and implantation of H$^+$ species in the Si substrate at an implantation energy of about 37 keV and an implantation dose of about 5.75×10$^{16}$ atoms/cm$^2$, namely steps S1 and S2 of FIG. 2. FIGS. 5 to 7 show the results obtained as a function of the conditions (duration and/or temperature) of the heat treatment step S3 (FIG. 1C) in accordance with the invention. The concentration measurements were carried out by Secondary Ion Mass Spectroscopy (SIMS).

FIG. 5 shows the influence of the duration of the heat treatment of the invention on contaminant trapping in the case of fluorine. The four plot lines of FIG. 5, $P_{350° C.-50 h}$, $P_{350° C.-30 h}$, $P_{350° C.-18 h}$, and $P_{350° C.-6 h}$, correspond to the concentration of fluorine observed in the thickness of the Si substrate implanted with hydrogen ions for a heat treatment carried out at a temperature of 350° C. for a respective period of 50 h, 30 h, 18 h and 6 h. It should be observed that the concentration of fluorine increases significantly at a mean depth of about 300 nm in the substrate, which corresponds to the implanted zone in which the contaminants are trapped.

The increase in the fluorine concentration in the trapping zone (i.e. at a mean depth of about 300 nm in the substrate) is greater when the heat treatment at 350° C. is carried out for a period of 50 h.

FIG. 6 shows the influence of the temperature of the heat treatment of the invention on the trapping of contaminants in the case of fluorine. The three plot lines of FIG. 6, $P_{350-51 h}$, $P_{400-2 h}$ and $P_{450° C.-8 mn}$, correspond to the concentration of fluorine observed in the thickness of a Si substrate implanted with hydrogen ions for a heat treatment carried out respectively at a temperature of 350° C. for a period of 51 h, a temperature of 400° C. for a period of 2 h, and a temperature of 450° C. for a period of 8 min. It should be observed that the concentration of fluorine increases significantly at a mean depth of about 300 nm in the substrate, which corresponds to the implanted zone in which the contaminants are trapped. The increase in the concentration of fluorine in the trapping zone (i.e. at a mean depth of about 300 nm in the substrate) is higher when the heat treatment is carried out at 350° C. for a period of 51 h. However, it should be observed that a heat treatment carried out at higher temperatures (400° C. and 450° C.) but for periods of much less than 51 h, namely 2 h for 400° C. and 8 min for 450° C., can also trap the fluorine effectively.

FIG. 7 shows the influence of post-implantation heat treatment as a function of the nature of the contaminants, in this case contaminants of the organic oxygen (O) and carbon (C) type.

$P_{O-impl}$ corresponds to the concentration of oxygen impurities observed in the thickness of the Si substrate implanted with hydrogen ions without heat treatment. $P_{O-400° C.-1h}$ corresponds to the concentration of oxygen impurities observed in the thickness of the Si substrate implanted with hydrogen ions subjected to heat treatment carried out at a temperature of 400° C. for a period of 1 h. $P_{C-impl}$ corresponds to the concentration of carbon impurities observed in the thickness of the Si substrate implanted with hydrogen ions without heat treatment. $P_{C-400° C.-1h}$ corresponds to the concentration of carbon impurities observed in the thickness of the Si substrate implanted with hydrogen ions subjected to heat treatment carried out at a temperature of 400° C. for a period of 1 h.

A reduction in the concentration of impurities is observed over the whole of the implanted substrate (the entire analyzed depth) and in particular over the entire thickness of the substrate (between 0 and 300 nm), corresponding to the thin film to be transferred. In this manner, the concentration of carbon impurity is reduced by a power of ten in the future thin film to be transferred.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of removing contaminants when fabricating a thin semiconductor film comprising:
    implanting ions by bombarding a face of a substrate comprising a semiconductor material to form a concentrated layer of the implanted ions at a predetermined mean depth in the substrate, the concentrated layer and the face of the substrate defining a thin film therebetween;
    bringing the face of the substrate into intimate contact with a stiffener;
    trapping contaminants of the thin film in the concentrated layer by heat treating the substrate such that the heat treatment does not split the substrate at the concentrated layer;
    after trapping the contaminants of the thin film in the concentrated layer, detaching the thin film from the substrate by splitting the substrate at the concentrated layer;
    after splitting the substrate at the concentrated layer, withdrawing a perturbed contaminated zone of a fractured surface of the thin film that contains contaminants from the concentrated layer; and
    annealing the thin film to the stiffener at a temperature of at least about 1000° C. after the withdrawing of the perturbed contaminated zone.

2. A method according to claim 1, wherein the implanted ions are ions of hydrogen gas.

3. A method according to claim 1, wherein the substrate comprises a substrate of silicon, germanium, silicon-germanium, gallium nitride, gallium arsenide or silicon carbide.

4. A method according to claim 1, wherein the substrate is a substrate of mono-crystalline silicon, and wherein the trapping heat treatment is carried out at a temperature in the range of from about 350° C. to about 450° C.

5. A method according to claim 1, wherein the trapping heat treatment is carried out at a temperature of about 350° C. for a period in the range from about 18 hours to about 51 hours.

6. A method according to claim 1, wherein the implanting comprises a first implanting, the concentrated layer comprises a first concentrated layer, the method further comprises a second implanting of ions by bombarding the face of the substrate to form a second concentrated layer of ions in the substrate, the second implanting utilizes an implantation energy greater than an implantation energy of the first implanting, and the second concentrated layer is disposed further from the face than the first concentrated layer.

7. A method according to claim 6, wherein ions utilized in the second implanting are ions of helium gas.

8. A method according to claim 7, wherein the substrate is a substrate of mono-crystalline silicon, and wherein the trapping heat treatment is carried out at a temperature of about 400° C. for a period of about 1 hour.

9. A method according to claim 6, wherein the trapping of the contaminants is carried out in the second concentrated layer and the detaching is carried out along the first concentrated layer.

10. A method according to claim 1, wherein the detaching comprises applying a detachment stress to the concentrated layer.

11. A method according to claim 10, wherein the detachment stress comprises applying a heat treatment, a mechanical detachment stress, a tensile stress, a bending stress, a shear stress, ultrasound waves, microwaves, or a combination thereof.

12. A method according to claim 1, wherein the detaching comprises annealing the substrate at a temperature greater than a temperature of the trapping heat treatment, to split the substrate at the concentrated layer.

13. A method according to claim 1, wherein the withdrawing comprises chemical-mechanical polishing, selective chemical attack, or a combination thereof.

14. A method according to claim 1, wherein the contaminants comprise atomic species introduced to the substrate.

15. A method according to claim 1, wherein the thickness of the contaminated zone that is removed is on the order of 1500 Å.

16. A method according to claim 1, wherein the face of the substrate is brought into intimate contact with the stiffener after the trapping.

17. A method according to claim 1, wherein the thin film is annealed after detaching.

* * * * *